United States Patent
Cheng et al.

(10) Patent No.: US 10,049,945 B2
(45) Date of Patent: Aug. 14, 2018

(54) FORMING A CMOS WITH DUAL STRAINED CHANNELS

(71) Applicant: International Business Machines Corporation, Armonk, NY (US)

(72) Inventors: Kangguo Cheng, Schenectady, NY (US); Pouya Hashemi, White Plains, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/796,947

(22) Filed: Oct. 30, 2017

(65) Prior Publication Data

US 2018/0068905 A1 Mar. 8, 2018

Related U.S. Application Data

(63) Continuation of application No. 15/378,080, filed on Dec. 14, 2016, now Pat. No. 9,911,662, which is a
(Continued)

(51) Int. Cl.
| | |
|---|---|
| *H01L 21/8238* | (2006.01) |
| *H01L 27/12* | (2006.01) |
| *H01L 21/84* | (2006.01) |
| *H01L 29/78* | (2006.01) |
| *H01L 21/033* | (2006.01) |
| *H01L 21/02* | (2006.01) |

(52) U.S. Cl.
CPC ........ *H01L 21/823821* (2013.01); *H01L 21/02236* (2013.01); *H01L 21/02532* (2013.01);
(Continued)

(58) Field of Classification Search
CPC ....... H01L 21/823821; H01L 21/02532; H01L 21/0332; H01L 29/66795; H01L 29/785;
(Continued)

(56) References Cited

U.S. PATENT DOCUMENTS

| | | |
|---|---|---|
| 6,723,541 B2 | 4/2004 | Sugii et al. |
| 6,919,258 B2 | 7/2005 | Grant et al. |

(Continued)

OTHER PUBLICATIONS

K. C. Liu et al., "A Novel Sidewall Strained-Si Channel nMOSFET," International Electron Devices Meeting, IEDM'99, 1999, pp. 63-66.

(Continued)

*Primary Examiner* — Sonya D McCall Shepard
(74) *Attorney, Agent, or Firm* — L. Jeffrey Kelly

(57) ABSTRACT

The present invention relates generally to a semiconductor device, and more particularly, to a structure and method of forming a compressive strained layer and a tensile strained layer on the same wafer. A lower epitaxial layer may be formed adjacent to a tensile strained layer. An upper epitaxial layer may be formed over a portion of the lower epitaxial layer. Thermal oxidation may convert the upper epitaxial layer to an upper oxide layer, and thermal condensation may causes a portion of the lower epitaxial layer to become a compressive strained layer. The upper oxide layer and a remaining portion of the lower epitaxial layer may be removed, leaving the tensile strained layer and the compressive strained layer.

20 Claims, 15 Drawing Sheets

Related U.S. Application Data continuation of application No. 15/288,124, filed on Oct. 7, 2016, now Pat. No. 9,892,978, which is a continuation of application No. 14/633,657, filed on Feb. 27, 2015, now Pat. No. 9,564,373.

(52) U.S. Cl.
CPC .. *H01L 21/0332* (2013.01); *H01L 21/823807* (2013.01); *H01L 21/845* (2013.01); *H01L 27/1211* (2013.01); *H01L 29/7843* (2013.01); *H01L 21/02255* (2013.01)

(58) Field of Classification Search
CPC .............. H01L 29/165; H01L 27/0886; H01L 21/823431; H01L 27/0924; H01L 29/0847; H01L 29/0649; H01L 21/845; H01L 21/324; H01L 21/30604; H01L 21/823814; H01L 29/41791; H01L 21/31116; H01L 29/7843; H01L 21/02236; H01L 27/1211; H01L 21/823807; H01L 21/02255

See application file for complete search history.

(56) References Cited

U.S. PATENT DOCUMENTS

| | | | |
|---|---|---|---|
| 6,974,733 B2 | 12/2005 | Boyanov et al. | |
| 7,388,259 B2 | 6/2008 | Doris et al. | |
| 7,442,967 B2 | 10/2008 | Ko et al. | |
| 7,524,740 B1* | 4/2009 | Liu | H01L 21/02532 438/479 |
| 7,777,250 B2 | 8/2010 | Lochtefeld | |
| 7,799,592 B2 | 9/2010 | Lochtefeld | |
| 8,034,697 B2 | 10/2011 | Fiorenza et al. | |
| 8,169,025 B2 | 5/2012 | Bedell et al. | |
| 8,183,627 B2 | 5/2012 | Currie | |
| 9,006,789 B2 | 4/2015 | Adam et al. | |
| 9,165,929 B2 | 10/2015 | Rim et al. | |
| 9,564,373 B2 | 2/2017 | Cheng et al. | |
| 9,620,626 B2* | 4/2017 | Allibert | H01L 29/66795 |
| 2008/0001169 A1 | 1/2008 | Lochtefeld | |
| 2008/0220594 A1* | 9/2008 | Clavelier | H01L 21/02381 438/492 |
| 2011/0108943 A1* | 5/2011 | Dennard | H01L 21/76254 257/506 |
| 2015/0155170 A1 | 6/2015 | Reboh et al. | |
| 2016/0190304 A1 | 6/2016 | Morin et al. | |
| 2017/0092546 A1 | 3/2017 | Cheng et al. | |
| 2017/0098583 A1 | 4/2017 | Cheng et al. | |

OTHER PUBLICATIONS

C. W. Liu et al., "Mobility-Enhancement Technologies," IEEE Circuits and Devices Magazine, No. 3, 2005, pp. 21-36.

IBM: List of IBM Patents or Patent Applications Treated As Related (Appendix P), Jan. 9, 2018, 2 pages.

\* cited by examiner

US 10,049,945 B2

FORMING A CMOS WITH DUAL STRAINED CHANNELS

BACKGROUND

The present invention relates generally to semiconductor devices, and more particularly, to a structure and method of forming a complementary metal-oxide semiconductor (CMOS) with dual strained channels.

In some FET devices, the introduction of strain (e.g., compressive or tensile) to the channel region of the FET may be used to improve carrier mobility, which may subsequently increase FET performance. Compressive strain may be used with p-channel PFETs to improve hole mobility and tensile strain may be used with NFETs to improve electron mobility. However, forming a semiconductor layer with a compressive strain and a semiconductor layer with a tensile strain on the same wafer is challenging.

SUMMARY

According to an embodiment, a method is disclosed. The method may include: forming a tensile strained layer on an upper surface of a substrate, the tensile strained layer comprising a tensile strained semiconductor material; and forming an epitaxial layer on the upper surface of the substrate, the epitaxial layer adjacent to the tensile strained layer; forming an upper epitaxial layer on an upper surface of the epitaxial layer; and performing a thermal oxidation process, such that the upper epitaxial layer is converted to an oxide and thermal condensation causes a portion of the epitaxial layer below to become a compressive strained layer.

According to an embodiment, another method is disclosed. The method may include: forming a first hardmask on a tensile strained semiconductor layer; removing a portion of the first hardmask to form an opening, the opening exposing an upper surface of the tensile strained semiconductor layer; removing a portion of the tensile strained semiconductor layer, selective to the first hardmask, down to a buried insulator layer, to form an undercut opening that it extends laterally beneath the first hardmask; forming a first epitaxial layer in the undercut opening adjacent to and contacting a sidewall of the tensile strained layer; forming a second epitaxial layer in the undercut opening adjacent to and contacting a sidewall of the first epitaxial layer; forming a third epitaxial layer in the undercut opening adjacent to and contacting the second epitaxial layer; removing the first hardmask; forming a second hardmask on an upper surface of the tensile strained semiconductor layer, an upper surface of the first epitaxial layer, an upper surface of the second epitaxial layer, and only a portion of an upper surface of the third epitaxial layer; forming an upper epitaxial layer on an exposed portion of the upper surface of the third epitaxial layer; and performing a thermal oxidation process, such that the upper epitaxial layer is converted to an upper oxide layer and thermal condensation causes a portion of the epitaxial layer below to become a compressive strained layer.

According to an embodiment, another method is disclosed. The method of forming a complementary metal-oxide semiconductor (CMOS) with dual strained channels may include: depositing an upper epitaxial layer only on a lower epitaxial layer, the lower epitaxial layer adjacent to a tensile strained layer; and performing a thermal oxidation process, such that the upper epitaxial layer is converted to an oxide and thermal condensation causes a portion of the lower epitaxial layer to become a compressive strained layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
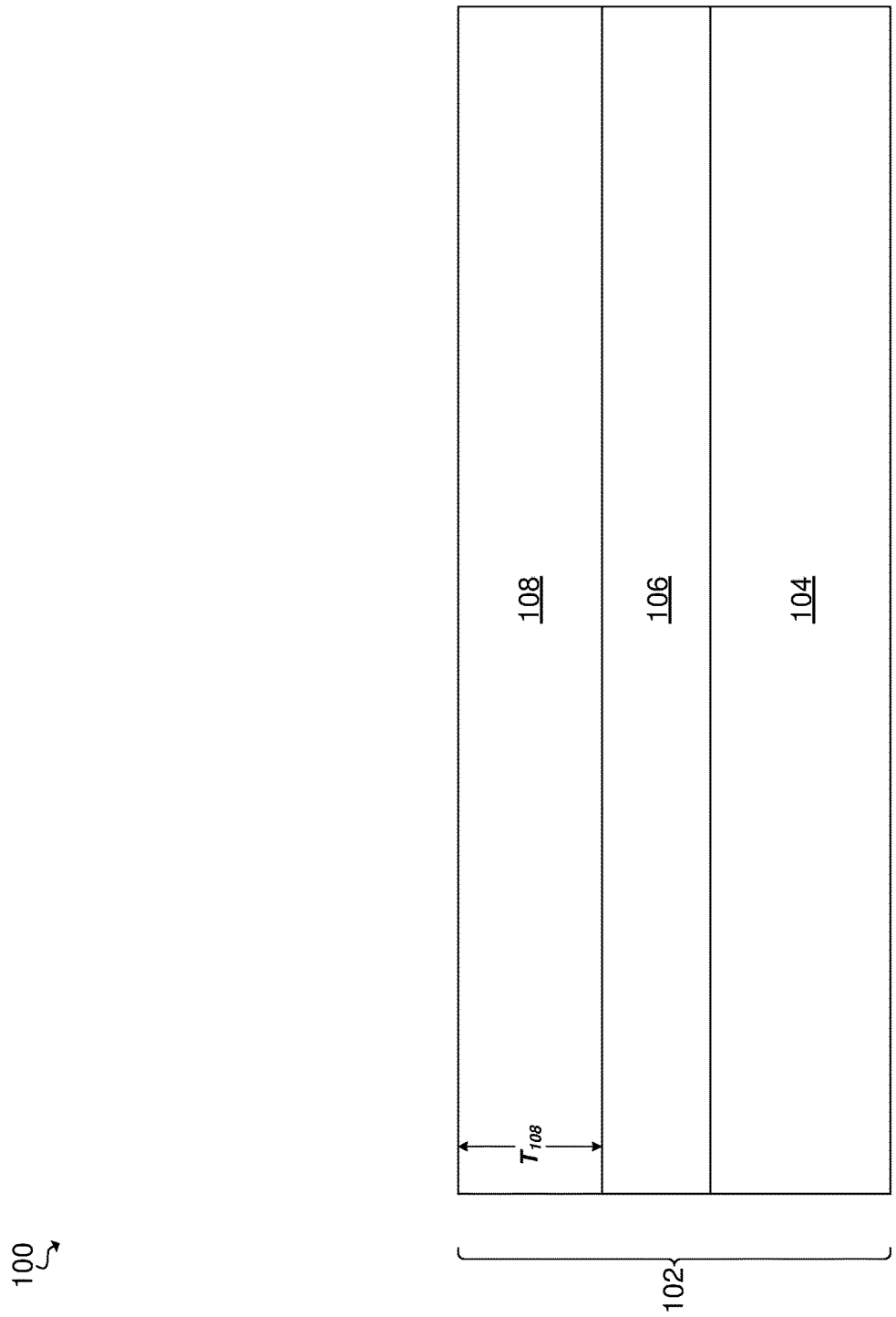
FIG. 1 is a cross section view of a structure having an upper layer, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. The temperature for epitaxial deposition typically ranges from 550° C. to 900° C. Although higher temperature typically results in faster deposition, the faster deposition may result in crystal defects and film cracking.

Embodiments of the present invention relates generally to semiconductor devices, and more particularly, to a structure and method of forming a semiconductor layer with a compressive strain and a semiconductor layer with a tensile strain on the same wafer using the same process. A plurality of fins may be formed in the semiconductor layer with a compressive strain, which may be used as a PFET. A plurality of fins may formed in the semiconductor layer with a tensile strain, which may be used as an NFET.

Strain engineering is a technique used in semiconductor fabrication to enhance device performance. Carrier mobility may be increased by inducing a strain (e.g. tension or compression) on the channel region of a semiconductor device. Due to the physical properties of the strained material, a fin field effect transistor (finFET) comprised of silicon germanium with a compressive strain may function well as a PFET device. A finFET comprised of silicon with a tensile strain may function well as a NFET device. Combining a PFET and a NFET device on the same wafer may have significant performance advantages. However, it is difficult to effectively combine a semiconductor layer with a compressive strain and a semiconductor layer with a tensile strain on the same wafer using conventional methods.

Embodiments of the present invention may combine a semiconductor layer with a compressive strain and a semiconductor layer with a tensile strain on the same wafer. By combining a semiconductor layer with a compressive strain and a semiconductor layer with a tensile strain on the same wafer, the present invention has the benefit of operating as both a PFET and a NFET on a single wafer. Methods of forming a semiconductor layer with a compressive strain and a semiconductor layer with a tensile strain on the same wafer, and the resulting structure, are described below with reference to FIGS. 1-12.

Referring now to FIG. 1, a cross section view of a structure 100 is shown. In an embodiment, the structure 100 may comprise a semiconductor on insulator (SOI) layer 102. The SOI layer 102 may comprise a substrate 104, a buried insulator layer 106, and a tensile strained layer 108. The substrate 104 may comprise a semiconductor material, such as, for example, silicon. The buried insulator layer 106 may comprise a dielectric material, such as, for example, silicon oxide, silicon nitride, silicon oxynitride, SiBCN, SiOCN, or a combination of dielectric materials. The tensile strained layer 108 may comprise any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the tensile strained layer 108 may comprise silicon. In a preferred embodiment, the tensile strained layer 108 may be bi-axially strained. The tensile strained layer 108 may have a thickness $T_{108}$ ranging from approximately 10 nm to approximately 500 nm.

Figure 2:
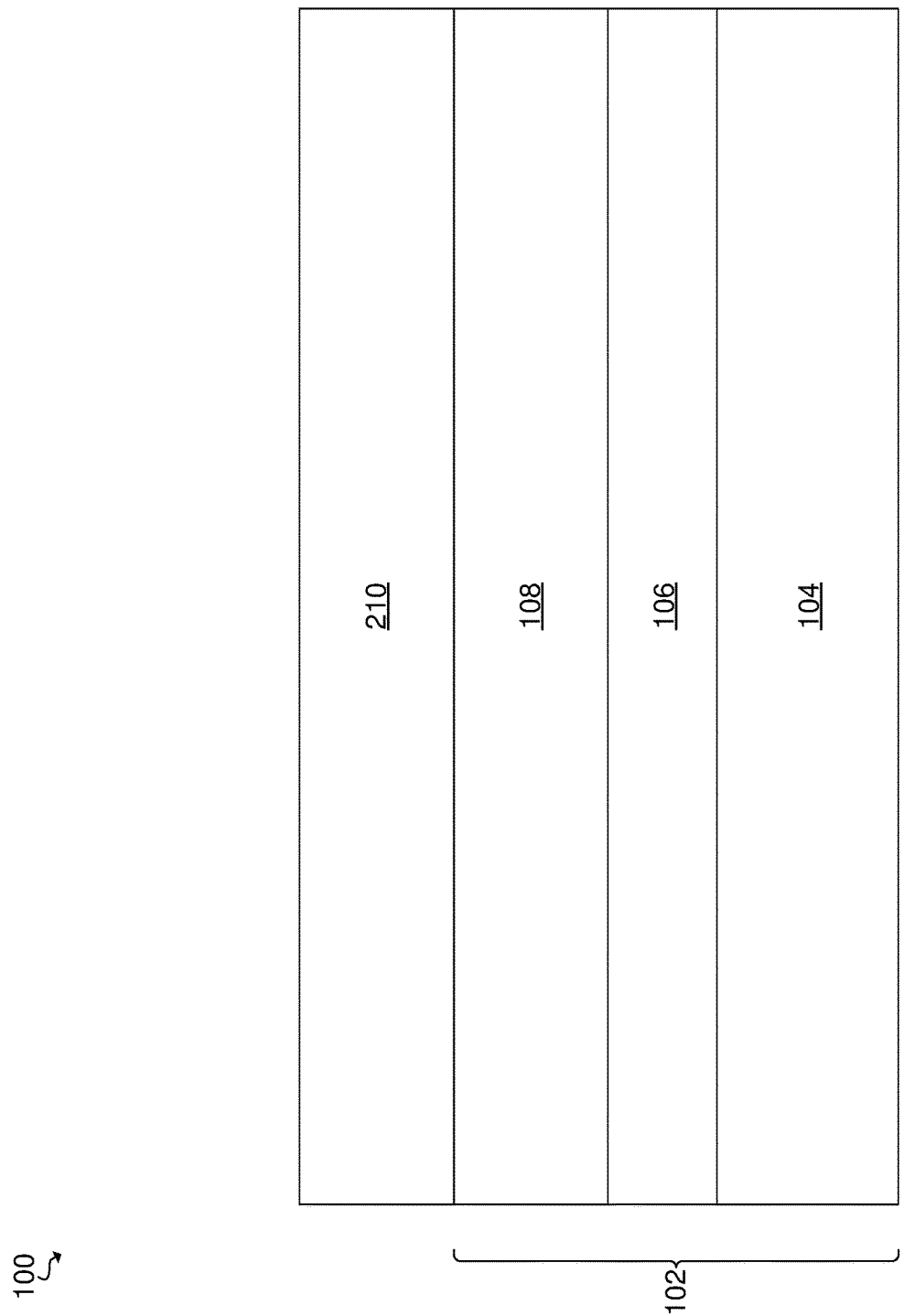
FIG. 2 is a cross section view illustrating forming a first hardmask, according to an embodiment of the present invention.

Referring now to FIG. 2, a cross section view of forming a first hardmask 210 on an upper surface of the tensile strained layer 108 is shown. The first hardmask 210 may be formed using any suitable deposition technique known the art, including, for example, atomic layer deposition (ALD), chemical vapor deposition (CVD), physical vapor deposition (PVD), molecular beam deposition (MBD), pulsed laser deposition (PLD), liquid source misted chemical deposition (LSMCD), sputtering, or platting. The first hardmask 210 may be comprised of a dielectric material, such as, for example, silicon nitride, silicon oxide, silicon oxynitride, SiBCN, SiOCN, or a combination of dielectric materials. In a preferred embodiment, the first hardmask 210 may comprise silicon nitride.

Figure 3:
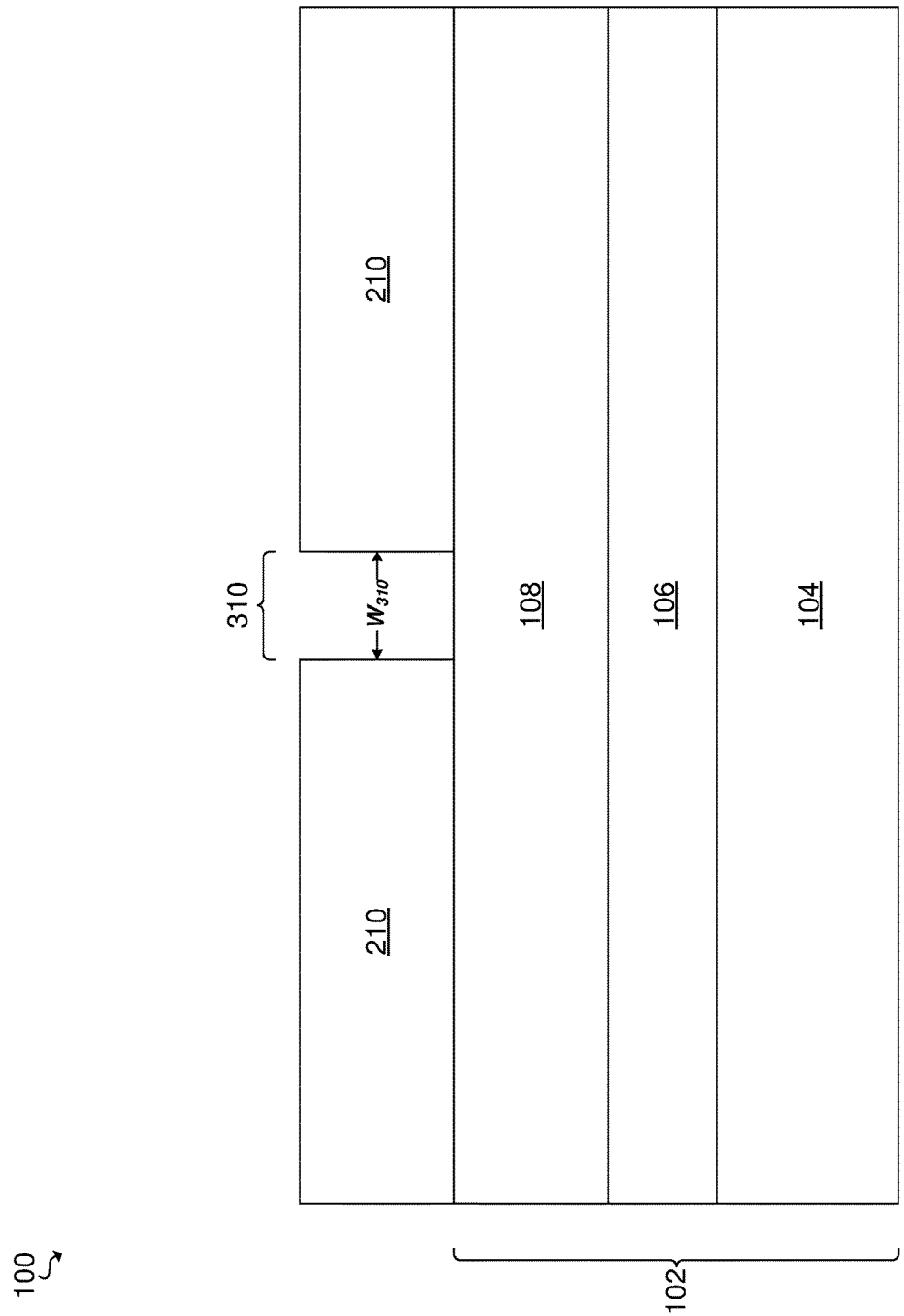
FIG. 3 is a cross section view of illustrating removing a portion of the first hardmask, according to an embodiment of the present invention.

Referring now to FIG. 3, a cross section view of removing a portion of the first hardmask 210 is shown. A portion of the first hardmask 210 may be removed to create an opening 310 exposing the upper surface of the tensile strained layer 108. The portion of the first hardmask 210 may be removed using a conventional etching process, such as, for example, reactive-ion etching (RIE). The opening 310 may have a width $W_{310}$ ranging from approximately 200 nm to approximately 5 µm.

Figure 4:
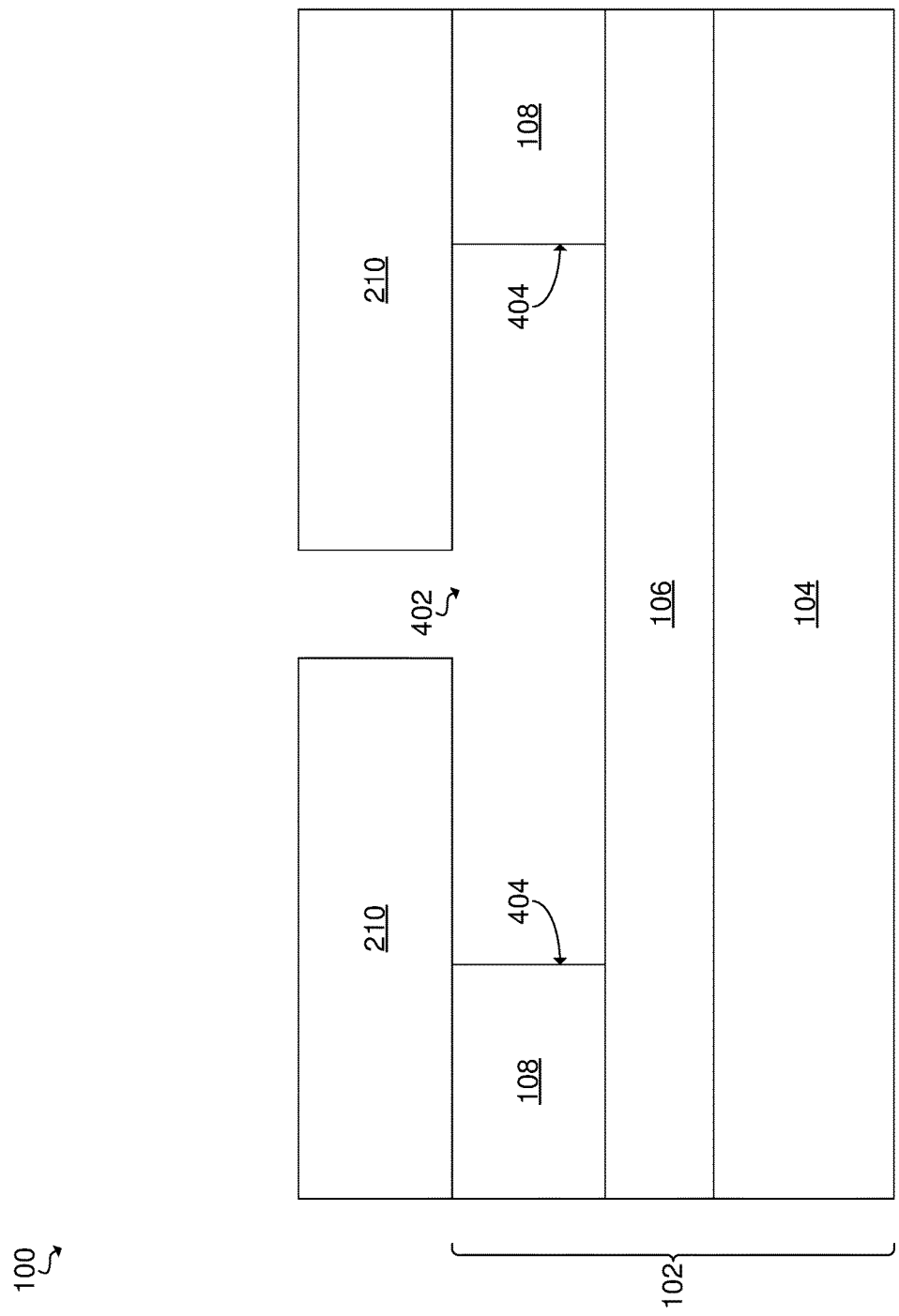
FIG. 4 is a cross section view of illustrating removing a portion of the upper layer of the structure to form an undercut opening, according to an embodiment of the present invention.

Referring now to FIG. 4, a cross section view of removing a portion of the tensile strained layer 108 to form an undercut opening 402 is shown. The portion of the tensile strained layer 108 may be removed selective to the first hardmask 210 and the buried insulator layer 106 to form an undercut region below the first hardmask 210. The undercut opening 402 may have substantially vertical sidewalls 404 located between an upper surface of the buried insulator layer 106 and a lower surface of the first hardmask 210. The portion of the tensile strained layer 108 may be removed using a conventional selective etching process, such as, for example, anisotropic wet etching. The anisotropic wet etch may be performed using any wet etchant known in the art, such as, for example, tetramethylammonium hydroxide (TMAH), potassium hydroxide (KOH), ethylene diamine pyrocatechol (EDP) solutions, or any combination of etchants. In a preferred embodiment, an anisotropic wet etch may be performed using TMAH.

Figure 5:
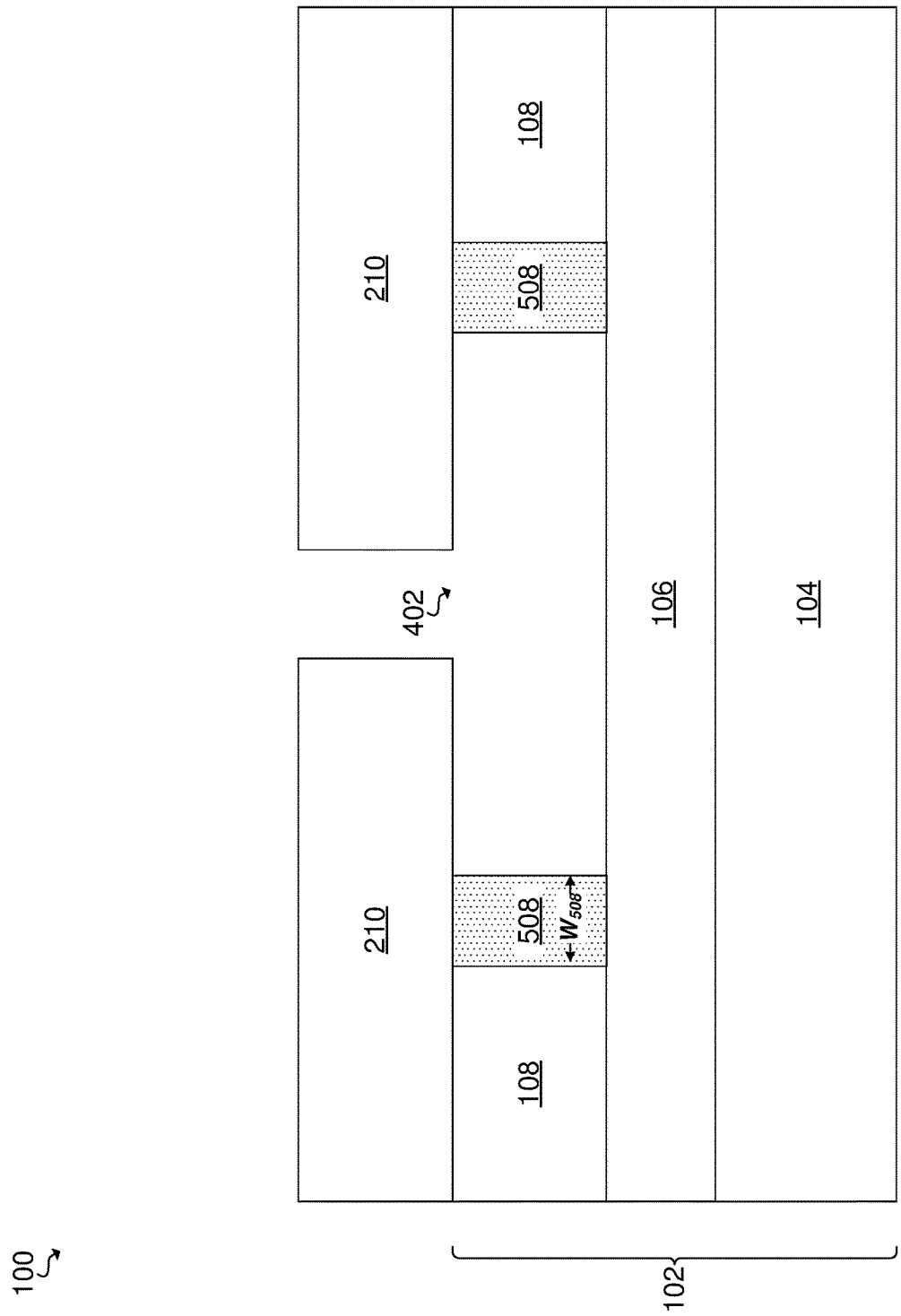
FIG. 5 is a cross section view illustrating forming a first epitaxial layer in the undercut opening, according to an embodiment of the present invention.

Referring now to FIG. 5, a cross section view of forming a first epitaxial layer 508 in the undercut opening 402 is shown. In an embodiment, the first epitaxial layer 508 may be formed on the upper surface of the buried insulator layer 106 and below the lower surface of the first hardmask 210, and may be adjacent to the sidewalls 404 (FIG. 4). The first epitaxial layer 508 may comprise any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the first epitaxial layer 508 may comprise silicon germanium with a high concentration of germanium, ranging from approximately 50 atomic percent to approximately 99 atomic percent. The first epitaxial layer 508 may be formed using a conventional deposition process, such as, for example, rapid thermal chemical vapor deposition (RTCVD), low-energy plasma deposition (LEPD), ultra-high vacuum chemical vapor deposition (UHVCVD), or atmospheric pressure chemical vapor deposition (APCVD). In a preferred embodiment, the first epitaxial layer 508 may be formed using a conventional epitaxial deposition process, such as molecular beam epitaxy (MBE). The first epitaxial layer 508 may be epitaxially grown laterally, starting from the sidewalls 404 and growing inward toward the center of the undercut opening 402. A lattice mismatch between the tensile strained layer 108 and the first epitaxial layer 508 may result in crystal lattice defects in the first epitaxial layer 508. Defects in the first epitaxial layer 508 may be confined using a defect restricting method known in the art, such as, for example, aspect ratio trapping. The first epitaxial layer 508 may have the same height as the tensile strained layer 108. The first epitaxial layer 508 may have a width $W_{508}$ ranging from approximately 100 nm to approximately 300 nm.

Figure 6:
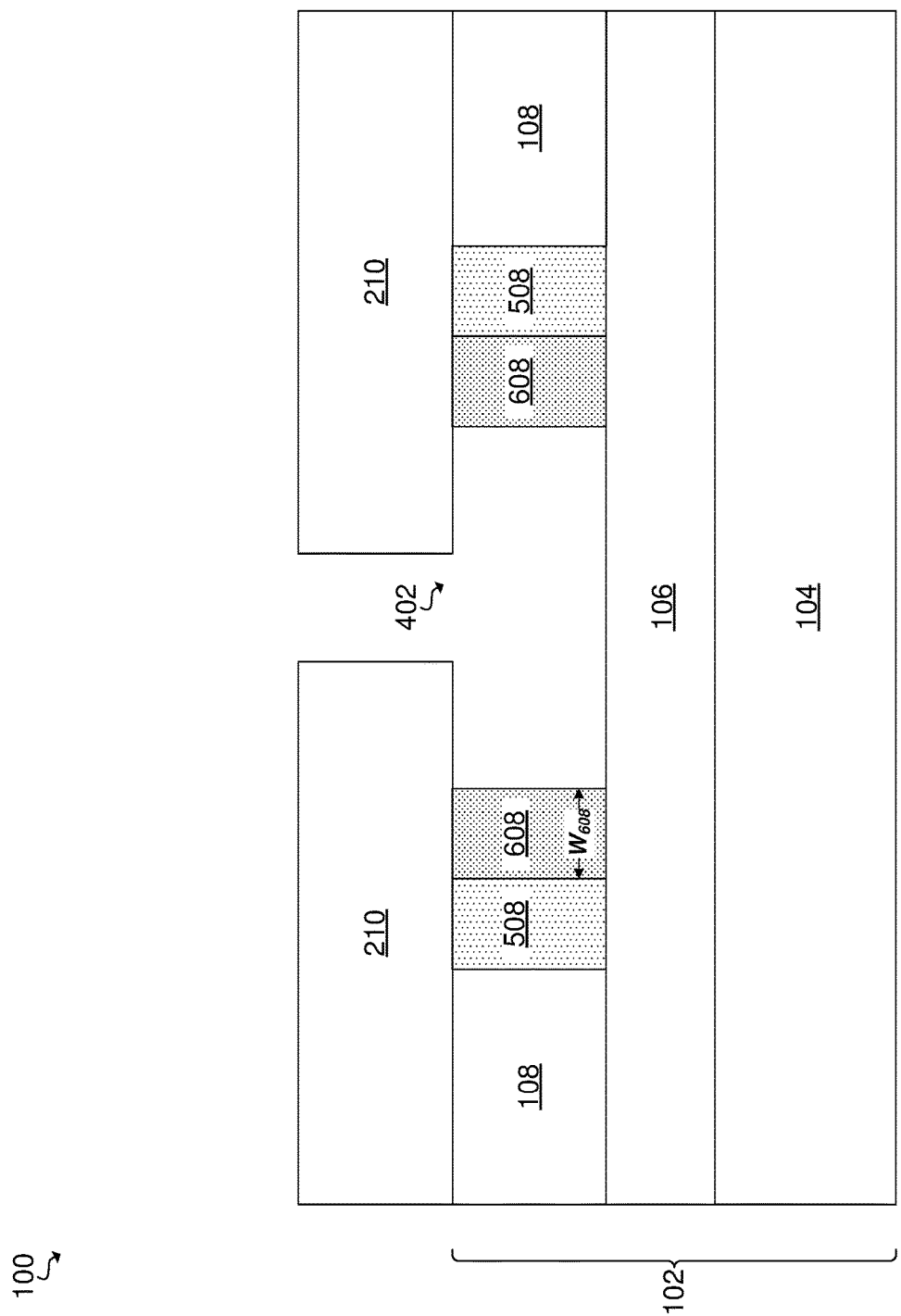
FIG. 6 is a cross section view illustrating forming a second epitaxial layer in the undercut opening, according to an embodiment of the present invention.

Referring now to FIG. 6, a cross section view of forming a second epitaxial layer 608 in the undercut opening 402 is shown. In an embodiment, the second epitaxial layer 608 may be formed on the upper surface of the buried insulator layer 106 and below the lower surface of the first hardmask 210, and may be adjacent to the first epitaxial layer 608. The second epitaxial layer 608 may comprise any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the second epitaxial layer 608 may comprise silicon. In an embodiment, the second epitaxial layer 608 may have a similar composition as the first epitaxial layer 508. In another embodiment, the second epitaxial layer 608 may have a different composition than the first epitaxial layer 508.

The second epitaxial layer 608 may be formed using a conventional deposition process known in the art, such as, for example, rapid thermal chemical vapor deposition (RTCVD), low-energy plasma deposition (LEPD), ultra-high vacuum chemical vapor deposition (UHVCVD), or atmospheric pressure chemical vapor deposition (APCVD). In a preferred embodiment, the second epitaxial layer 608 may be formed using a conventional epitaxial deposition process, such as molecular beam epitaxy (MBE). A lattice mismatch between the first epitaxial layer 508 and the second epitaxial layer 608 may result in crystal lattice defects in the second epitaxial layer 608. Defects in the second epitaxial layer 608 may be confined using a defect restricting method, such as, for example, lateral aspect ratio trapping. The second epitaxial layer 608 may have the same height as the tensile strained layer 108. The second epitaxial layer 608 may have a width $W_{608}$ ranging from approximately 100 nm to approximately 300 nm.

Figure 7A:
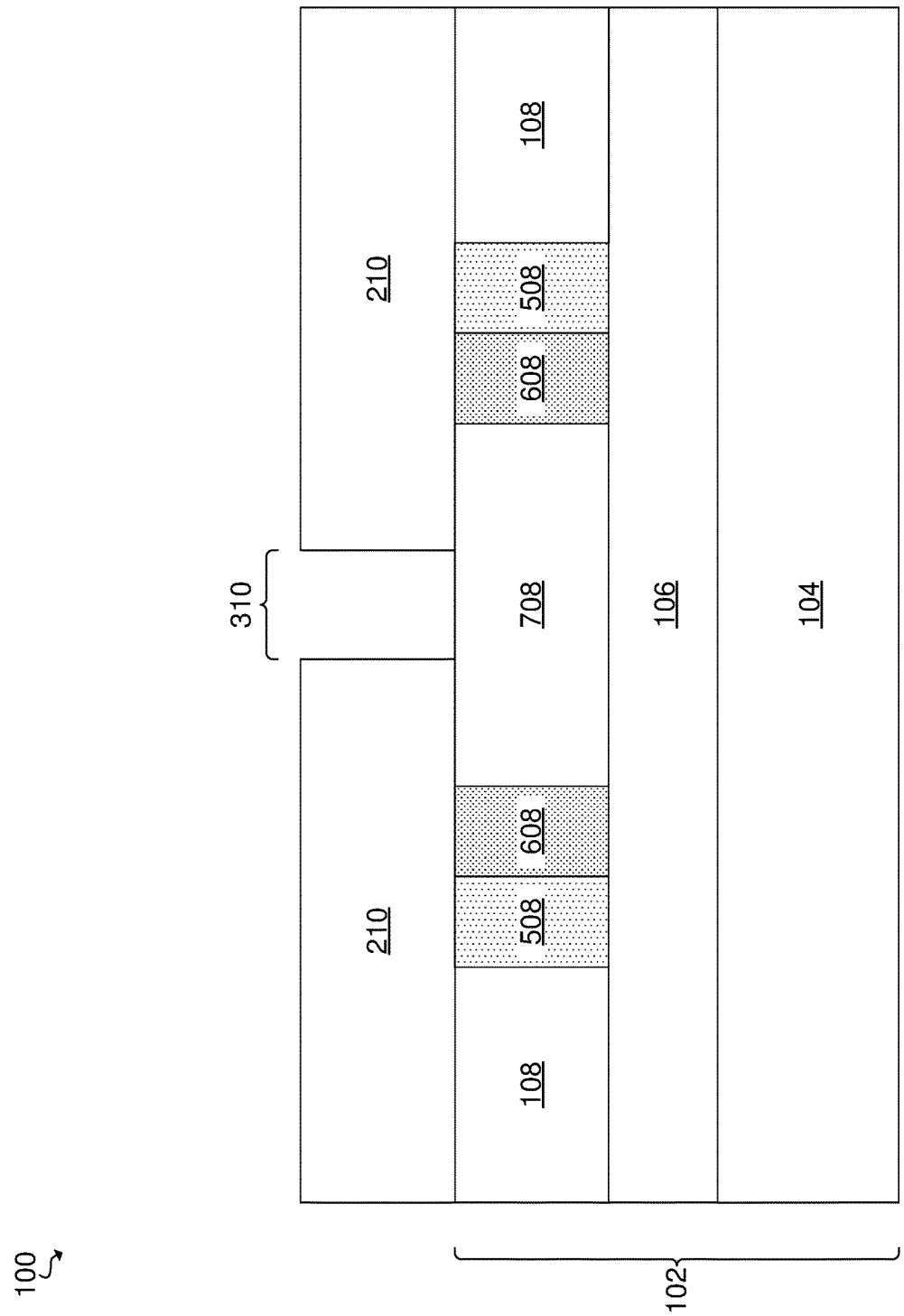
FIG. 7A is a cross section view illustrating forming a third epitaxial layer in the undercut opening, according to an embodiment of the present invention.
Figure 7B:
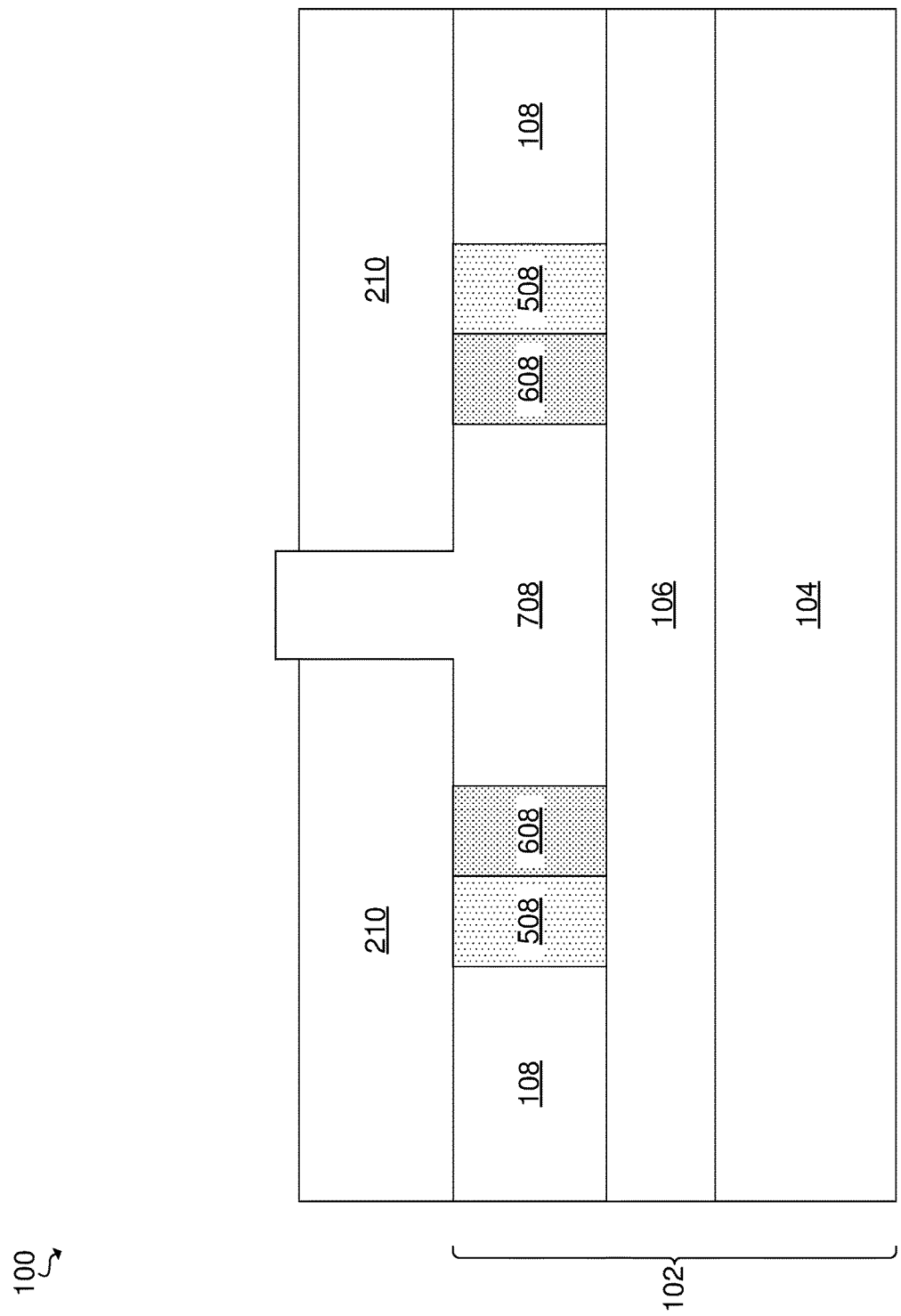
FIG. 7B is a cross section view illustrating forming a third epitaxial layer in the undercut opening, according to an embodiment of the present invention.

Referring now to FIG. 7A and FIG. 7B, a cross section view of forming a third epitaxial layer 708 in the undercut opening 402 (FIG. 6) is shown. The third epitaxial layer 708 may comprise any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the third epitaxial layer 708 may be comprised of the same material as the second epitaxial layer 608 so that little to no lattice mismatch exists between the third epitaxial layer 708 and the second epitaxial layer 608. In an embodiment, the third epitaxial layer 708 may be formed from the same deposition process as the second epitaxial layer 608 and exist merely as the defect free region formed after the second epitaxial layer 608 without a distinct boundary with the second epitaxial layer 608. The third epitaxial layer 708 may be relaxed and free of any crystal lattice defects. The third epitaxial layer 708 may be formed using a conventional deposition process known in the art, such as, for example, rapid thermal chemical vapor deposition (RTCVD), low-energy plasma deposition (LEPD), ultra-high vacuum chemical vapor deposition (UHVCVD), or atmospheric pressure chemical vapor deposition (APCVD). In a preferred embodiment, the third epitaxial layer 708 may be formed using a conventional epitaxial deposition process, such as molecular beam epitaxy (MBE).

In an embodiment, as shown in FIG. 7A, the third epitaxial layer 608 may have the same height as the tensile strained layer 108. In another embodiment, as shown in FIG. 7B, a middle portion of the third epitaxial layer 708 may extend upwards through the opening 310 (FIG. 3) and may have a height greater than the tensile strained layer 108. A portion of the third epitaxial layer 708 above an upper portion of the hardmask 210 may be removed by a conventional material removal process known in the art, such as, for example, chemical mechanical planarization (CMP). In an embodiment, the middle portion of the third epitaxial layer 708 within the opening 310 may be oxidized by any oxidation method known in the art, such as, for example, thermal oxidation. Thermal oxidation may be used to oxidize only the portion of the third epitaxial layer located within the opening 310. The oxidized portion of the third epitaxial layer may be removed using a conventional etching process, such as, for example, a buffered oxide etch or an aqueous hydrofluoric acid (HF) etch.

Figure 8:
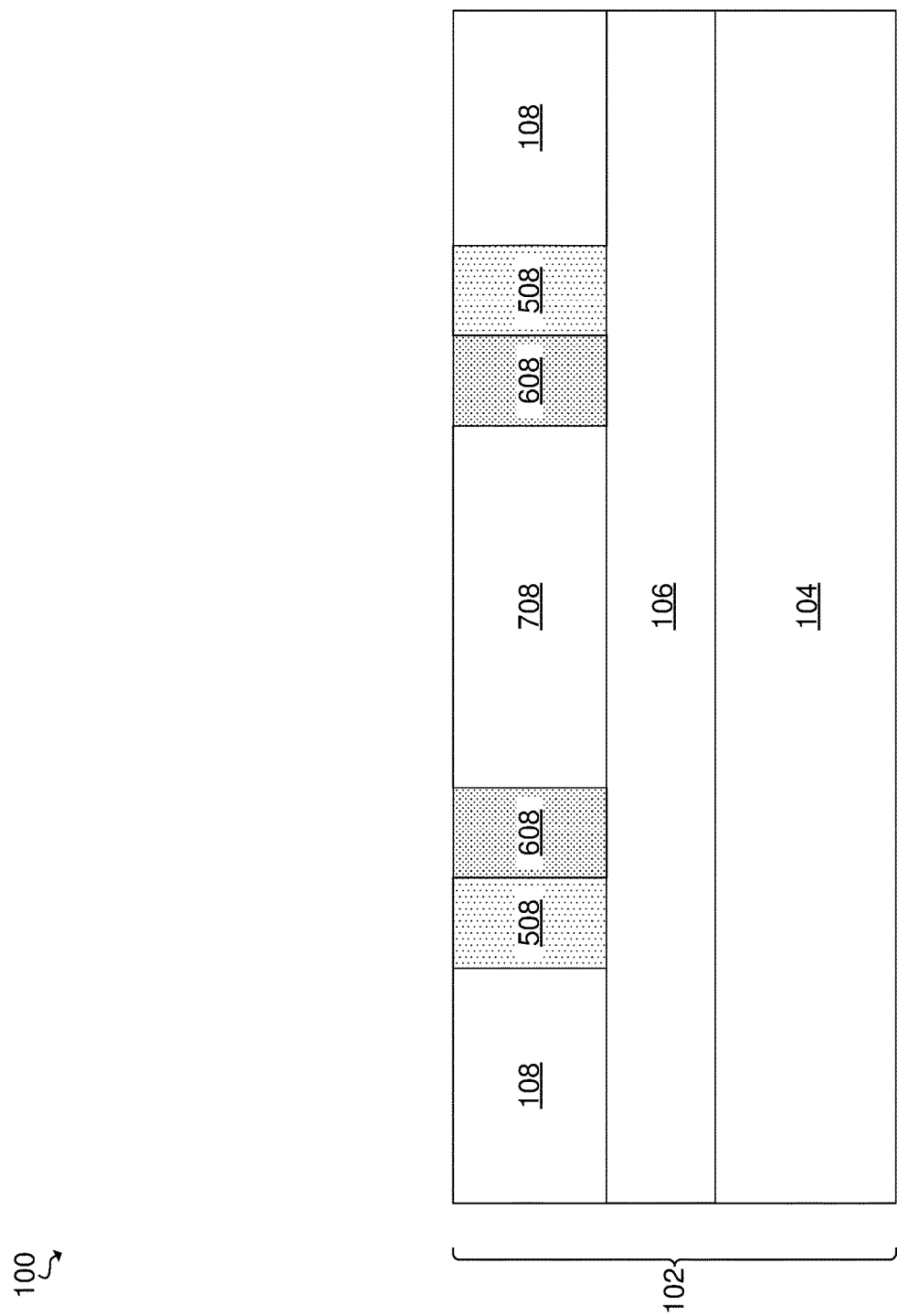
FIG. 8 is a cross section view illustrating removing the first hardmask, according to an embodiment of the present invention.

Referring now to FIG. 8, a cross section view of removing the first hardmask 210 (FIG. 7) is shown. The first hardmask 210 may be removed using a conventional etching process, such as, for example, reactive-ion etching (RIE) or a hot phosphoric acid etch. In another embodiment, the first hardmask 210 may be removed using a conventional planarization process, such as, for example, CMP. In a preferred embodiment, a wet etch may be used to remove the first hardmask 210, which may minimize damage to underlying layers. After the first hardmask 210 is removed, an upper surface of the tensile strained layer 108, the first epitaxial layer 508, the second epitaxial layer 608, and the third epitaxial layer 708 may be exposed.

Figure 9:
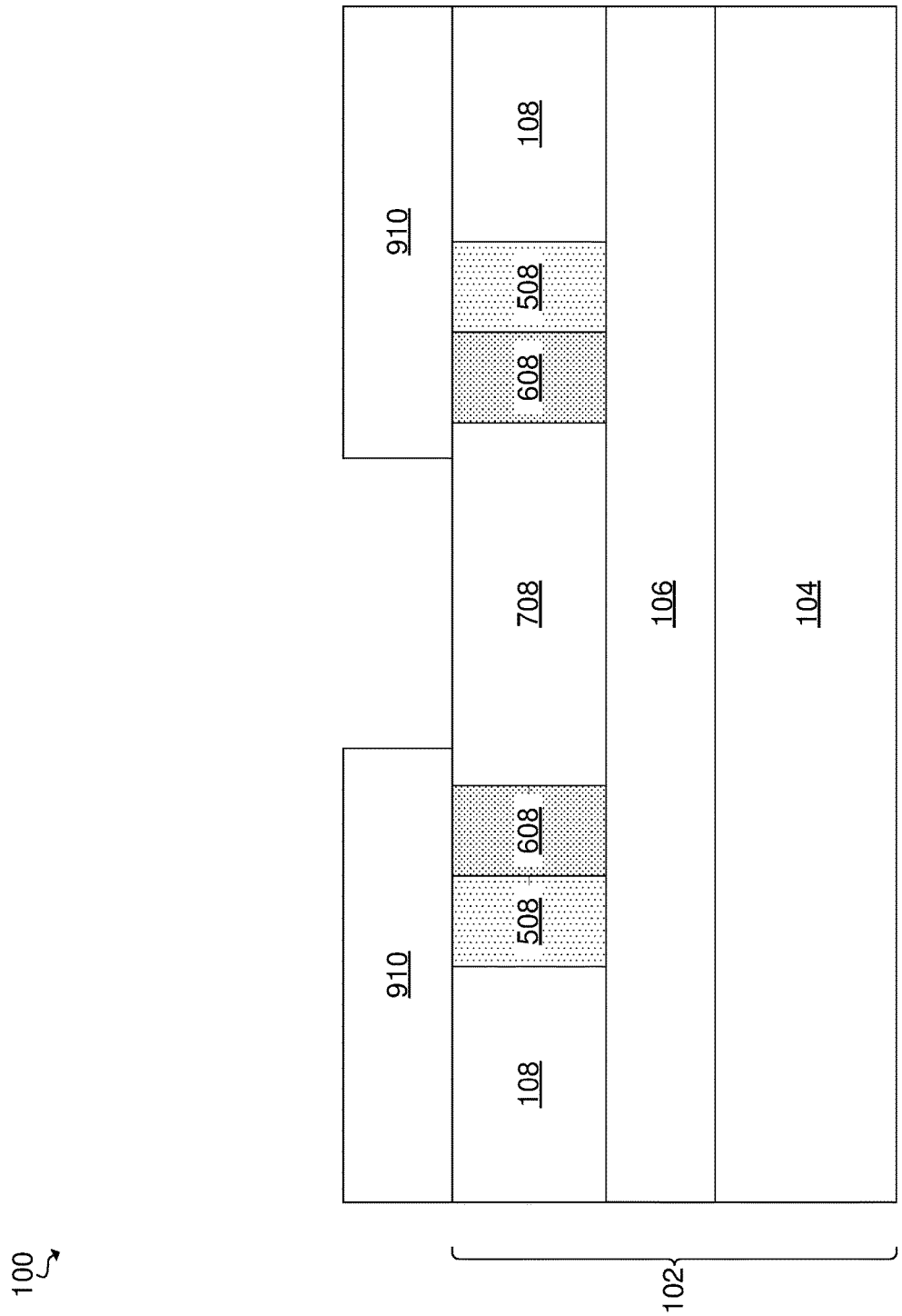
FIG. 9 is a cross section view illustrating forming a second hardmask, according to an embodiment of the present invention.

Referring now to FIG. 9, a cross section view of forming a second hardmask 910 on the upper surface of the tensile strained layer 108, the upper surface of the first epitaxial layer 508, the upper surface of the second epitaxial layer 608, and the upper surface of the third epitaxial layer 708 is shown. In an embodiment, the second hardmask 910 may extend only partially onto the third epitaxial layer 708 from each side, preferably by a width ranging from approximately 50 nm to approximately 100 nm, such that a middle portion of the third epitaxial layer 708 remains exposed. The second hardmask 910 may be formed using any suitable deposition technique known the art, including, for example, atomic layer deposition (ALD), chemical vapor deposition (CVD), physical vapor deposition (PVD), molecular beam deposition (MBD), pulsed laser deposition (PLD), liquid source misted chemical deposition (LSMCD), sputtering, or platting. The second hardmask 910 may be comprised of a dielectric material, such as, for example, silicon nitride, silicon oxide, silicon oxynitride, SiBCN, SiOCN, or a combination of dielectric materials. In a preferred embodiment, the second hardmask 910 may comprise silicon nitride.

Figure 10:
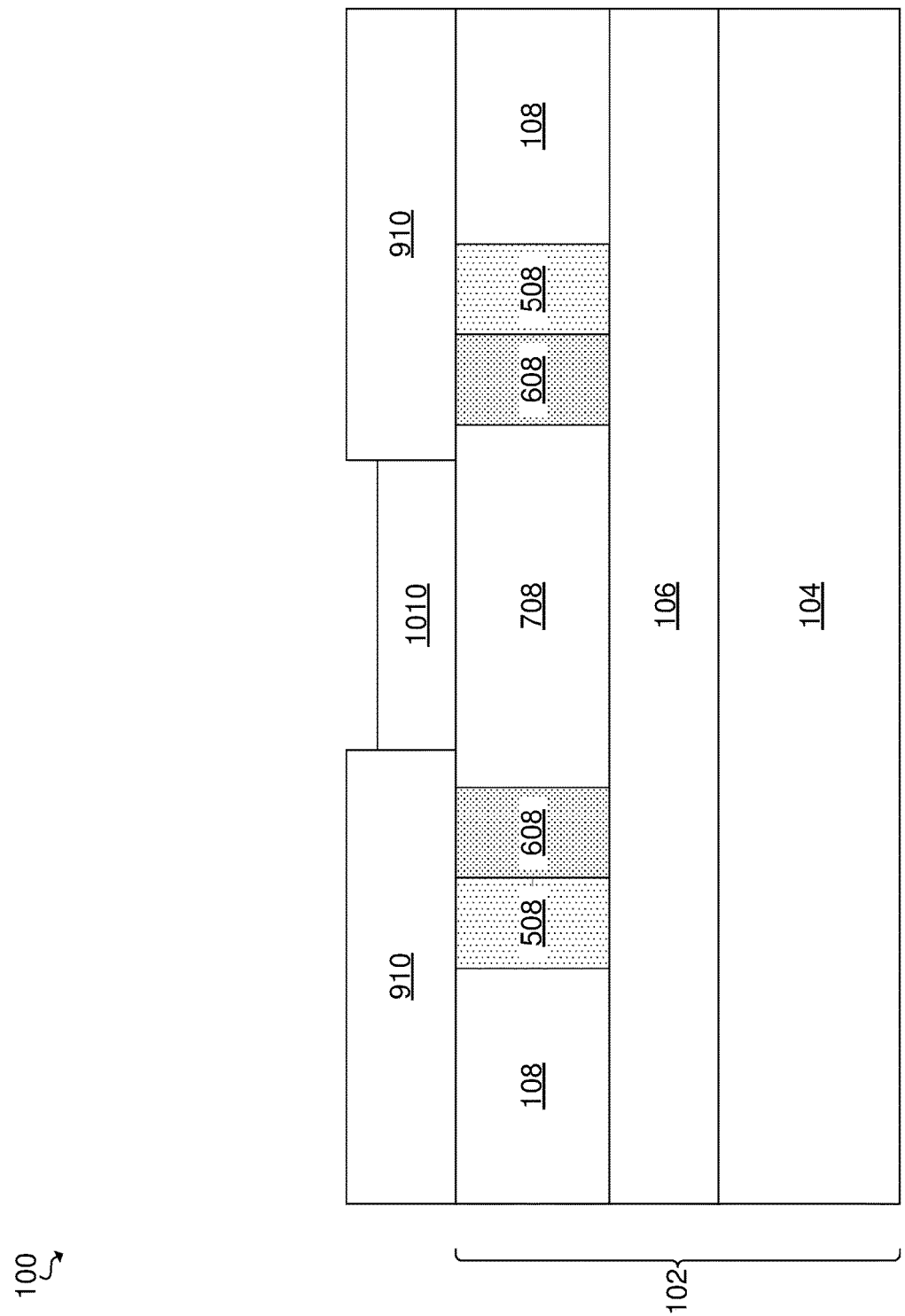
FIG. 10 is a cross section view illustrating forming an upper epitaxial layer, according to an embodiment of the present invention.

Referring now to FIG. 10, a cross section view of forming an upper epitaxial layer 1010 on the exposed upper surface of the third epitaxial layer 708 is shown. The upper epitaxial layer 1010 may comprise any semiconductor material known in the art, including, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In a preferred embodiment, the upper epitaxial layer 1010 may be comprised of silicon germanium. The upper epitaxial layer 1010 may comprise silicon germanium with a germanium concentration ranging from approximately 10 atomic percent to approximately 80 atomic percent. In a preferred embodiment, the upper epitaxial layer 1010 may comprise silicon germanium with a germanium concentration ranging from approximately 20 atomic percent to approximately 60 atomic percent. The upper epitaxial layer 1010 may have a larger crystal lattice structure than the third epitaxial layer 708, resulting in a compressive strain on the upper epitaxial layer 1010.

The upper epitaxial layer 1010 may be formed using a conventional deposition process known in the art, such as, for example, rapid thermal chemical vapor deposition (RTCVD), low-energy plasma deposition (LEPD), ultra-high vacuum chemical vapor deposition (UHVCVD), or atmospheric pressure chemical vapor deposition (APCVD). In a preferred embodiment, the upper epitaxial layer 1010 may be formed using a conventional epitaxial deposition process, such as molecular beam epitaxy (MBE).

Figure 11:
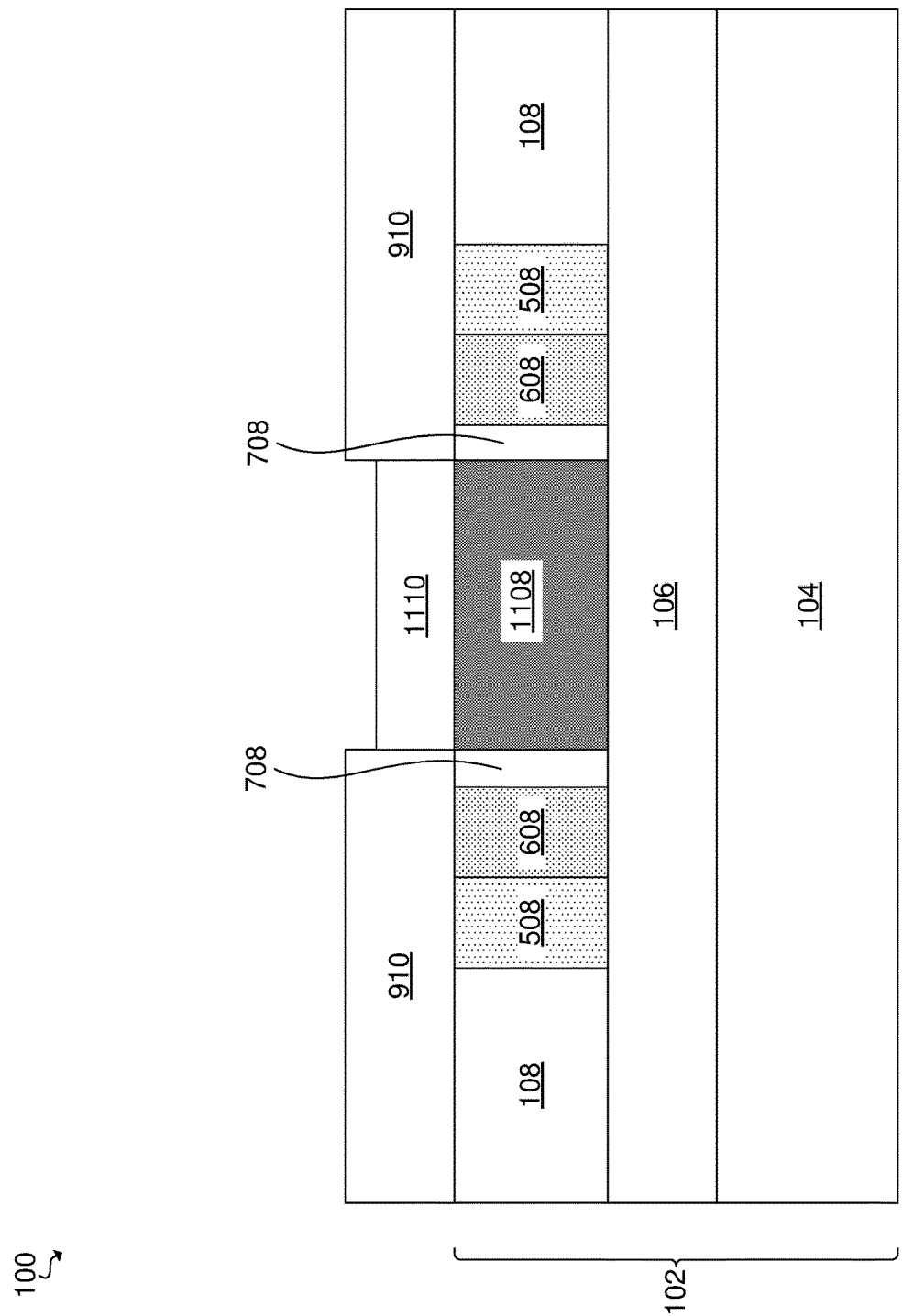
FIG. 11 is a cross section view illustrating forming a compressive strained layer and a upper oxide layer, according to an embodiment of the present invention.

Referring now to FIG. 11, a cross section view of converting a portion of the third epitaxial layer 708 to a compressive strained layer 1108 and converting the upper epitaxial layer 1010 (FIG. 10) to an upper oxide layer 1110 is shown. In an embodiment, the compressive strained layer 1108 and the upper oxide layer 1110 may be formed by performing a thermal oxidation process combined with a thermal condensation process. The thermal oxidation process may result in oxidization of substantially all of the upper epitaxial layer 1010. During the thermal oxidation process, oxygen atoms may selectively bond with silicon atoms in the upper epitaxial layer 1010, which may result in thermal condensation. Thermal condensation occurs when germanium atoms diffuse from the upper epitaxial layer 1010 downwards into the third epitaxial layer 708.

The upper oxide layer 1110 may be composed of a dielectric material, such as, for example, silicon oxide. As a result of thermal condensation, a portion of the third epitaxial layer 708 below the upper oxide layer 1110 may be converted into a compressive strained layer 1108. The compressive strained layer 1108 may be comprised of semiconductor material, such as, for example, silicon germanium. The thermal condensation process may cause a compressive strain in the compressive strained layer 1108 because of the migration of large germanium atoms into an approximately fixed volume within the compressive strained layer 1108.

Figure 12:
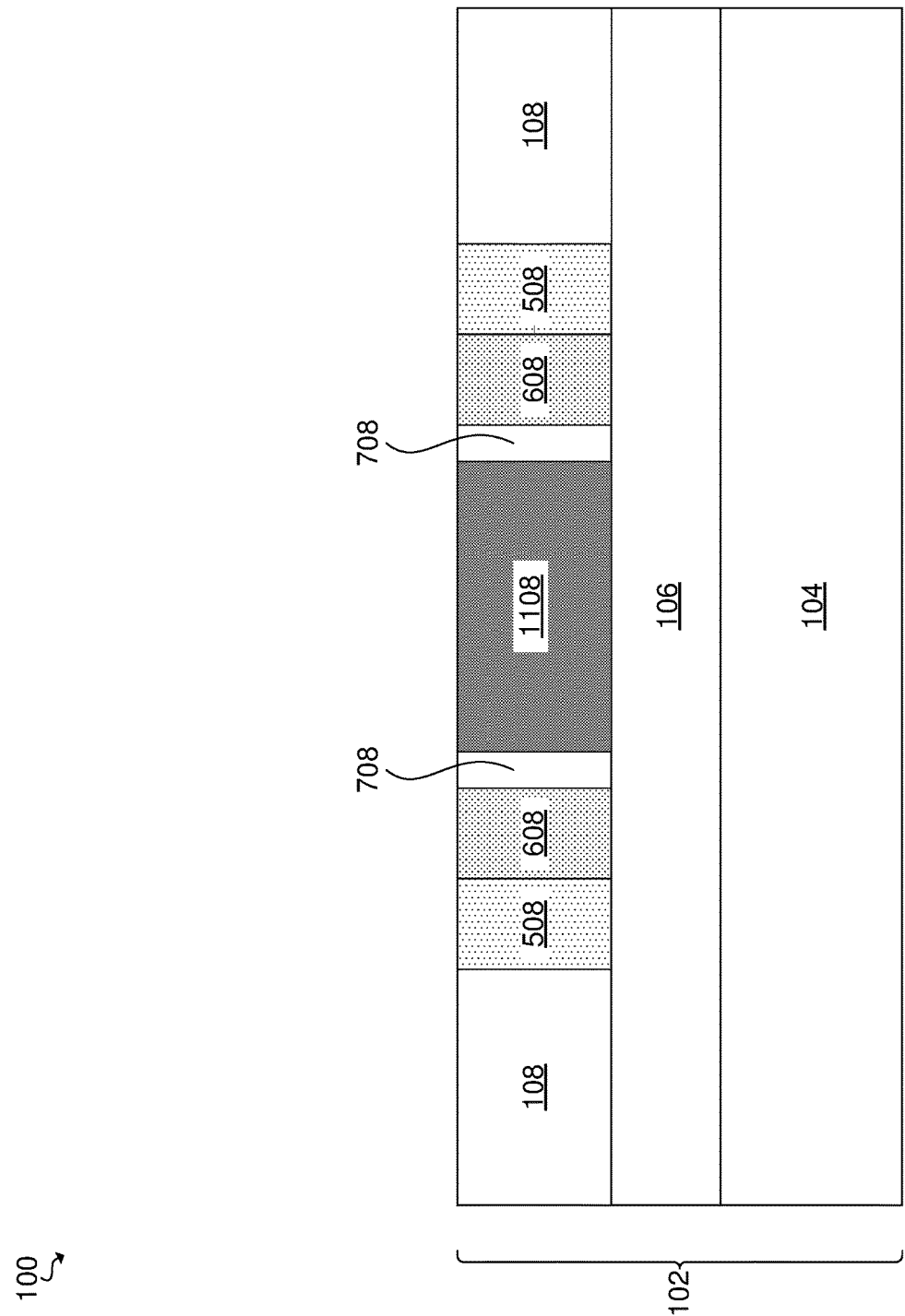
FIG. 12 is a cross section view illustrating removing the second hardmask and the upper oxide layer, according to an embodiment of the present invention.

Referring now to FIG. 12, a cross section view of removing the upper oxide layer 1110 (FIG. 11) and the second hardmask 910 (FIG. 11) is shown. The upper oxide layer 1110 may be removed using a conventional etching process, such as, for example, a buffered oxide etch or aqueous hydrofluoric acid (HF) etch. The second hardmask 910 may be removed using a conventional etching process, such as, for example, RIE or a hot phosphoric acid etch. In an embodiment, the upper oxide layer 1110 and the second hardmask 910 may be removed using a conventional planarization process, such as, for example, CMP. In a preferred embodiment, a selective wet etch may be used to remove the second hardmask 910, which may minimize damage to underlying layers.

Figure 13:
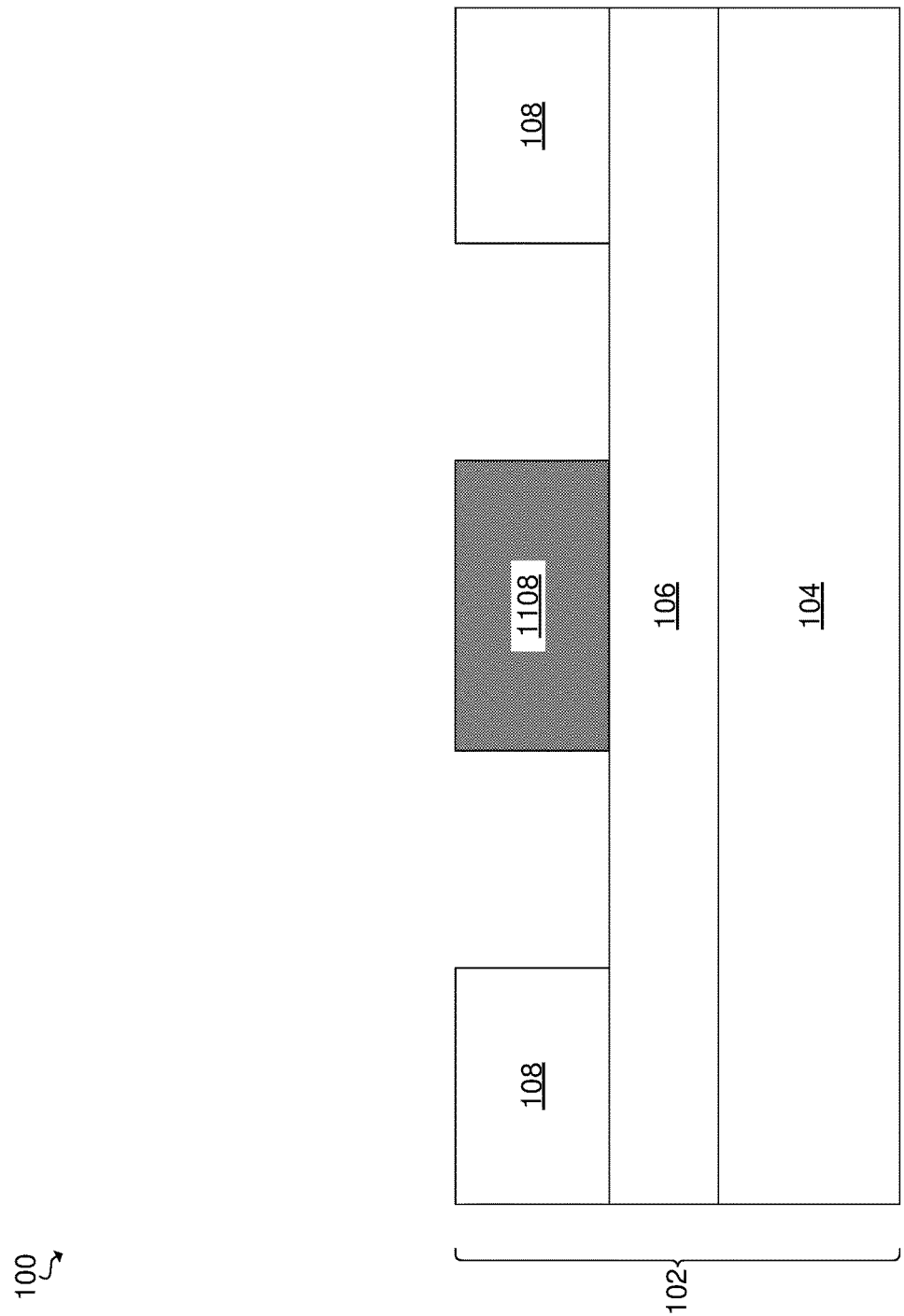
FIG. 13 is a cross section view illustrating removing the first epitaxial layer, the second epitaxial layer, and a remaining portion of the third epitaxial layer, according to an embodiment of the present invention.

Referring now to FIG. 13, a cross section view of removing the first epitaxial layer 508, the second epitaxial layer 608, and a remaining portion of the third epitaxial layer 708. The first epitaxial layer 508, the second epitaxial layer 608, and a remaining portion of the third epitaxial layer 708 may be removed using a conventional etching process, such as, for example, RIE.

Figure 14:
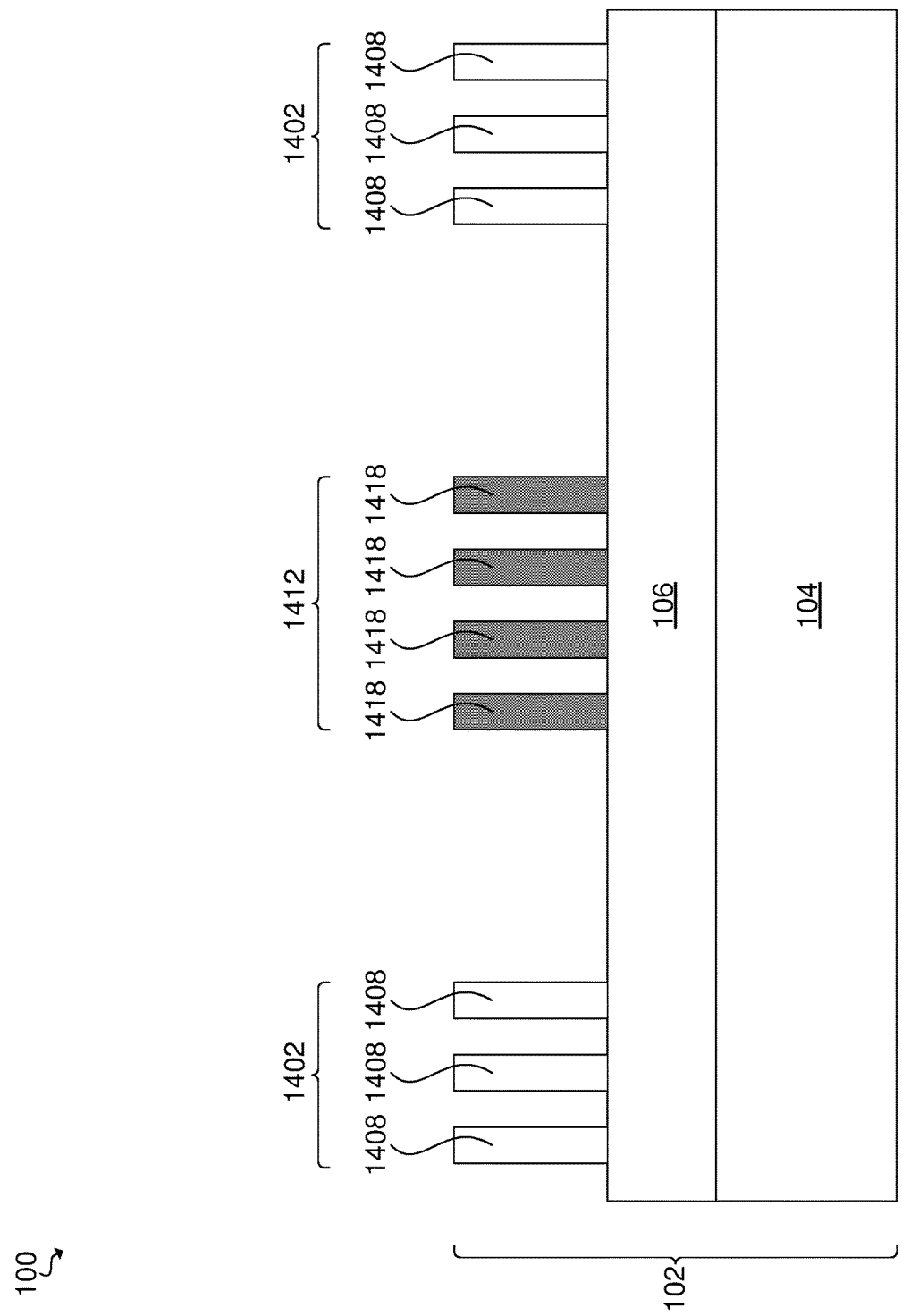
FIG. 14 is a cross section view illustrating forming one or more fins, according to an embodiment of the present invention.

Referring now to FIG. 14, a cross section view of forming one or more strained fins 1408 (hereinafter "strained fins") and one or more compressive fins 1418 (hereinafter "compressive fins). The strained fins 1408 may be formed by removing a portion of the tensile strained layer 108 (FIG. 11) using a conventional material removal process, such as, for example, sidewall image transfer (SIT). The strained fins 1408 may form one or more strained active regions 1402 (hereinafter "strained active regions"). In an embodiment, the strained active regions 1402 may serve as a NFET. The compressive fins 1418 may be formed by removing a portion of the compressive strained layer 1108 (FIG. 11) using a conventional material removal process, such as, for example, sidewall image transfer (SIT). The compressive fins 1418 may form one or more compressive active regions 1412 (hereinafter "compressive active regions"). In an embodiment, the compressive active regions 1412 may serve as a PFET.

The present invention offers the benefit of combining a semiconductor layer with a compressive strain and a semiconductor layer with a tensile strain on the same wafer. The semiconductor layer with a compressive strain may be used to form one or more fins for use as a PFET. The semiconductor layer with a tensile strain may be used to form one or more fins for use as an NFET. By combining a semiconductor layer with a compressive strain and a semiconductor layer with a tensile strain on the same wafer, using the same process, the present invention has the benefit of forming both a PFET and a NFET in a single device with fewer processing steps than conventional techniques.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming an upper epitaxial layer on an upper surface of an epitaxial layer, the epitaxial layer being on the upper surface of the substrate, wherein the epitaxial layer comprises a first epitaxial layer in contact with a sidewall of a tensile strained semiconductor layer, a second epitaxial layer in contact with a sidewall of the first epitaxial layer, and a third epitaxial layer in contact with a sidewall of the second epitaxial layer; and
    performing a thermal oxidation process, such that the upper epitaxial layer is converted to an oxide and thermal condensation causes a portion of the epitaxial layer to become a compressive strained semiconductor layer.

2. The method of claim 1, wherein the tensile strained semiconductor layer comprises silicon.

3. The method of claim 1, wherein the compressive strained semiconductor layer comprises silicon germanium.

4. The method of claim 1, wherein the first epitaxial layer and the tensile strained semiconductor layer have a crystal lattice mismatch ranging from approximately 1.5 percent to approximately 4 percent.

5. The method of claim 1, wherein the second epitaxial layer and the first epitaxial layer have a crystal lattice mismatch ranging from approximately 1.4 percent to approximately 4 percent.

6. The method of claim 1, wherein the third epitaxial layer and the second epitaxial layer have substantially similar crystal lattice structures.

7. The method of claim 1, wherein forming the epitaxial layer comprises:
    growing epitaxial material using lateral aspect ratio trapping.

8. The method of claim 1, further comprising:
    removing a portion of the compressive strained semiconductor layer to form one or more compressive fins; and
    removing a portion of the tensile strained semiconductor layer to form one or more tensile fins.

9. A method of forming a complementary metal-oxide semiconductor (CMOS) with dual strained channels comprising:
    depositing an upper epitaxial layer only on a lower epitaxial layer, the lower epitaxial layer adjacent to a tensile strained semiconductor layer; and
    performing a thermal oxidation process, such that the upper epitaxial layer is converted to an oxide and thermal condensation causes a portion of the lower epitaxial layer to become a compressive strained semiconductor layer
    removing a portion of the compressive strained semiconductor layer to form one or more compressive fins; and
    removing a portion of the tensile strained semiconductor layer to form one or more tensile fins.

10. The method of claim 9, wherein the tensile strained semiconductor layer comprises silicon.

11. The method of claim 9, wherein the compressive strained semiconductor layer comprises silicon germanium.

12. The method of claim 9, wherein the tensile strained semiconductor layer is separated from the lower epitaxial layer by at least another epitaxial layer.

13. The method of claim 9, wherein the tensile strained semiconductor layer and the lower epitaxial layer are all substantially equal in height.

14. A method comprising:
    forming a first epitaxial layer on an upper surface of a semiconductor substrate adjacent to and contacting a sidewall of a tensile strained semiconductor layer;
    forming a second epitaxial layer on the upper surface of the semiconductor substrate adjacent to and contacting a sidewall of the first epitaxial layer;
    forming a third epitaxial layer on the upper surface of the semiconductor substrate adjacent to and contacting the second epitaxial layer;
    forming a hardmask on an upper surface of the tensile strained semiconductor layer, an upper surface of the first epitaxial layer, an upper surface of the second epitaxial layer, and only a portion of an upper surface of the third epitaxial layer;
    forming an upper epitaxial layer on an exposed portion of the upper surface of the third epitaxial layer; and
    performing a thermal oxidation process, such that the upper epitaxial layer is converted to an upper oxide layer and thermal condensation causes a portion of the third epitaxial layer immediately below the upper epitaxial layer to become a compressive strained semiconductor layer.

15. The method of claim 14, wherein the tensile strained semiconductor layer is comprised of silicon.

16. The method of claim 14, wherein the compressive strained semiconductor layer is comprised of silicon germanium.

17. The method of claim 14, wherein forming the first epitaxial layer and forming the second epitaxial layer comprises:
    growing epitaxial material laterally using lateral aspect ratio trapping.

18. The method of claim 14, wherein the first epitaxial layer and the tensile strained semiconductor layer have a crystal lattice mismatch ranging from approximately 1.5 percent to approximately 4 percent.

19. The method of claim 14, wherein the second epitaxial layer and the first epitaxial layer have a crystal lattice mismatch ranging from approximately 1.5 percent to approximately 4 percent.

20. The method of claim 14, further comprising:
- removing a portion of the compressive strained semiconductor layer to form one or more compressive fins; and
- removing a portion of the tensile strained semiconductor layer to form one or more tensile fins.

* * * * *